(12) United States Patent
Rowen et al.

(10) Patent No.: US 11,053,601 B2
(45) Date of Patent: Jul. 6, 2021

(54) ELECTROPLATED AU FOR CONFORMAL COATING OF HIGH ASPECT RATIO SILICON STRUCTURES

(71) Applicant: National Technology & Engineering Solutions of Sandia, LLC, Albuquerque, NM (US)

(72) Inventors: Adam M. Rowen, Livermore, CA (US); Robert K. Grubbs, Albuquerque, NM (US); Jonathan Joseph Coleman, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 374 days.

(21) Appl. No.: 16/174,744

(22) Filed: Oct. 30, 2018

(65) Prior Publication Data
US 2019/0074100 A1 Mar. 7, 2019

Related U.S. Application Data

(62) Division of application No. 14/081,342, filed on Nov. 15, 2013, now Pat. No. 10,147,510.

(51) Int. Cl.
*G21K 1/00* (2006.01)
*C25D 3/48* (2006.01)
(Continued)

(52) U.S. Cl.
CPC .............. *C25D 3/48* (2013.01); *C23C 16/045* (2013.01); *C23C 16/18* (2013.01);
(Continued)

(58) Field of Classification Search
CPC ..... G21K 1/025; G21K 1/06; G21K 2207/005
See application file for complete search history.

(56) References Cited

U.S. PATENT DOCUMENTS 6,210,555 B1 4/2001 Taylor et al.
6,879,051 B1* 4/2005 Singh .................... C23C 16/045
257/301
(Continued)

FOREIGN PATENT DOCUMENTS

WO 2012103357 A1 8/2012

OTHER PUBLICATIONS

Aaltonen, T., et al., "Atomic Layer Deposition of Platinum Thin Films", Chem. Mater., 15, (2003), 1924-1928.
(Continued)

*Primary Examiner* — Dani Fox
(74) *Attorney, Agent, or Firm* — Madelynne J. Farber; Martin I. Finston

(57) ABSTRACT

A method for electroplating a nonmetallic grating including providing a nonmetallic grating; performing an atomic layer deposition (ALD) reaction to form a seed layer on the nonmetallic grating; and electroplating a metallic layer on the seed layer such that the metallic layer uniformly and conformally coats the nonmetallic grating. An apparatus including a silicon substrate having gratings with an aspect-ratio of at least 20:1; a atomic layer deposition (ALD) seed layer formed on the gratings; and an electroplated metallic layer formed on the seed layer, wherein the electroplated metallic layer uniformly and conformally coats the gratings.

15 Claims, 6 Drawing Sheets

(51) Int. Cl.
| | |
|---|---|
| G21K 1/06 | (2006.01) |
| C25D 17/02 | (2006.01) |
| C23C 16/455 | (2006.01) |
| C23C 16/18 | (2006.01) |
| C25D 7/12 | (2006.01) |
| G21K 1/02 | (2006.01) |
| C25D 5/18 | (2006.01) |
| C23C 16/04 | (2006.01) |

(52) U.S. Cl.
CPC .. *C23C 16/45553* (2013.01); *C23C 16/45555* (2013.01); *C23C 16/45561* (2013.01); *C25D 5/18* (2013.01); *C25D 7/123* (2013.01); *C25D 17/02* (2013.01); *G21K 1/025* (2013.01); *G21K 1/06* (2013.01); *G21K 2207/005* (2013.01)

(56) References Cited

U.S. PATENT DOCUMENTS

| | | |
|---|---|---|
| 8,334,202 B2 | 12/2012 | Pohl et al. |
| 2004/0256222 A1 | 12/2004 | Griego et al. |
| 2004/0266167 A1 | 12/2004 | Dubin et al. |
| 2006/0154389 A1 | 7/2006 | Doan |
| 2007/0025139 A1 | 2/2007 | Parsons |
| 2010/0181610 A1 | 7/2010 | Kim et al. |
| 2010/0220832 A1 | 9/2010 | Ning et al. |
| 2012/0077053 A1 | 3/2012 | Akolkar et al. |
| 2012/0080318 A1 | 4/2012 | Gillen et al. |
| 2013/0008796 A1 | 1/2013 | Silverman et al. |
| 2013/0161195 A1 | 6/2013 | Yan et al. |
| 2014/0211920 A1* | 7/2014 | Setomoto .............. B81B 3/0008 378/70 |

OTHER PUBLICATIONS

David, C., et al., "Fabrication of diffraction gratings for hard X-ray phase contract imaging," Microelectronic engineering, 84, 2007, p. 1172-1177.

Elam, J. W., et al., "Viscous flow reactor with quartz crystal microbalances for thin film growth by atomic layer deposition," Review of Scientific Instruments, vol. 73, No. 8, 2002, p. 2981-2987.

Lee, M-K., et al., "Hierarchical gold micro-nanostructures based on three-dimensional networks of carbon nanotubes fabricated by using electrochemical deposition," Journal of Korean Physical Society, vol. 60, No. 7, 2012, p. 1135-1139.

Kaoyeros, A.., et al., "Copper electroplating on zero-thickness ALD platinum for nanoscale computer chip interconnects," Mater. Res. Soc. Symp. Proc. vol. 914, 2006.

Groner, M. D., et al., "Electrical characterization of thin Al2O3 films grown by atomic layer deposition on silicon and various metal substrates," Thin Solid Films, 413, 2002, p. 186-197.

Coleman, J., et al., "Highly conformal gold coatings on high aspect ration silicon gratings," COMS Aug.-Sep. 2011, Greensboro, NC.

IBM, "Electroplating System," Nov. 1975, IBM Technical Disclosure Bulletin, 17, 6, p. 1737-1739.

Kohl, P. A., "Electrodeposition of gold," Modern Electroplating, Fifth Edition, 2010, p. 115-130.

Pardon, G. et al., "Pt—Al2O3 dual layer atomic layer deposition coating in high aspect ration nanopores," Nanotechnology, 24, 2012, 015602.

* cited by examiner

ELECTROPLATED AU FOR CONFORMAL COATING OF HIGH ASPECT RATIO SILICON STRUCTURES

CROSS-REFERENCE TO RELATED APPLICATION

This application is a divisional application of, and discloses subject matter that is related to subject matters disclosed in, co-pending parent application U.S. Ser. No. 14/081,342, filed Nov. 15, 2013 and entitled "ELECTROPLATED AU FOR CONFORMAL COATING OF HIGH ASPECT RATIO SILICON STRUCTURES". The present application claims the priority of its parent application, which is incorporated herein by reference in its entirety for any purpose.

GOVERNMENT RIGHTS

This invention was developed under Contract DE-AC04-94AL85000 between Sandia Corporation and the U.S. Department of Energy. The U.S. Government has certain rights in this invention.

FIELD OF THE INVENTION

The present invention relates in general to coating structures, more specifically, electroplating high aspect ratio silicon structures with gold. Other embodiments are also described and claimed.

BACKGROUND

New gratings based on phase contrast imaging techniques have been developed to extend the capabilities of x-ray imaging. Radiography has been utilized for over a hundred years, however, the use of gratings based on phase contrast imaging techniques now allows for the detection of phase shifts in addition to absorption. The gratings must be fine enough in pitch to avoid limiting special resolution, and thick enough to absorb x-rays. To meet these criteria, the gratings must be formed or coated with a high x-ray absorbing material at high aspect ratios making the fabrication process challenging. Various processes have been used to fabricate such gratings. One such process is the use of a traditional LIGA process to form gold gratings. The LIGA process uses x-ray lithography to obtain polymer structures with vertical and extremely smooth sidewalls to form gold gratings. Gold gratings made by the LIGA process are functional and structurally rigid, however, LIGA processes are costly and time consuming. Another process utilizes reactive-ion etching (RIE) of silicon to generate high aspect-ratio trenches, for example 1 micron wide and 25-35 microns tall on a 4 micron pitch. RIE of silicon allows for precise and repeatable fabrication of substrates that are transparent to x-rays. The trenches are then coated with a 1 micron thick high density metal creating a 50% duty 1 micron wide, 25-35 micron tall grating. The coating of high aspect-ratio trenches tends to collect at the top of the grating and thin towards the base of the grating due to the depth of the trench. Thus, the resulting layer is neither uniform in thickness nor conformal to the shape of the grating.

SUMMARY

An embodiment of the invention includes a process for pulse electroplating thick and conformal metal coatings on high aspect-ratio structures, such as silicon x-ray gratings for phase contrast imaging (PCI). Representatively, in one embodiment, the process includes providing a nonmetallic grating and performing an atomic layer deposition (ALD) reaction to form a seed layer on the nonmetallic grating. The process may further include electroplating a metallic layer on the seed layer such that the metallic layer uniformly and conformally coats the nonmetallic grating. The nonmetallic grating may be a high aspect-ratio grating, for example, a grating having an aspect-ratio of greater than 20:1, for example, at least 26:1 or at least 50:1. In one embodiment, the seed layer may be a platinum layer and the metallic layer may be a gold layer.

An embodiment of the invention may further include an apparatus including a silicon substrate having gratings with an aspect-ratio of at least 20:1. An atomic layer deposition (ALD) seed layer may be formed on the gratings and an electroplated metallic layer may be formed on the seed layer. The electroplated metallic layer may be formed in such a manner that it uniformly and conformally coats the gratings.

The above summary does not include an exhaustive list of all aspects of the present invention. It is contemplated that the invention includes all devices, systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description.

Figure 1:
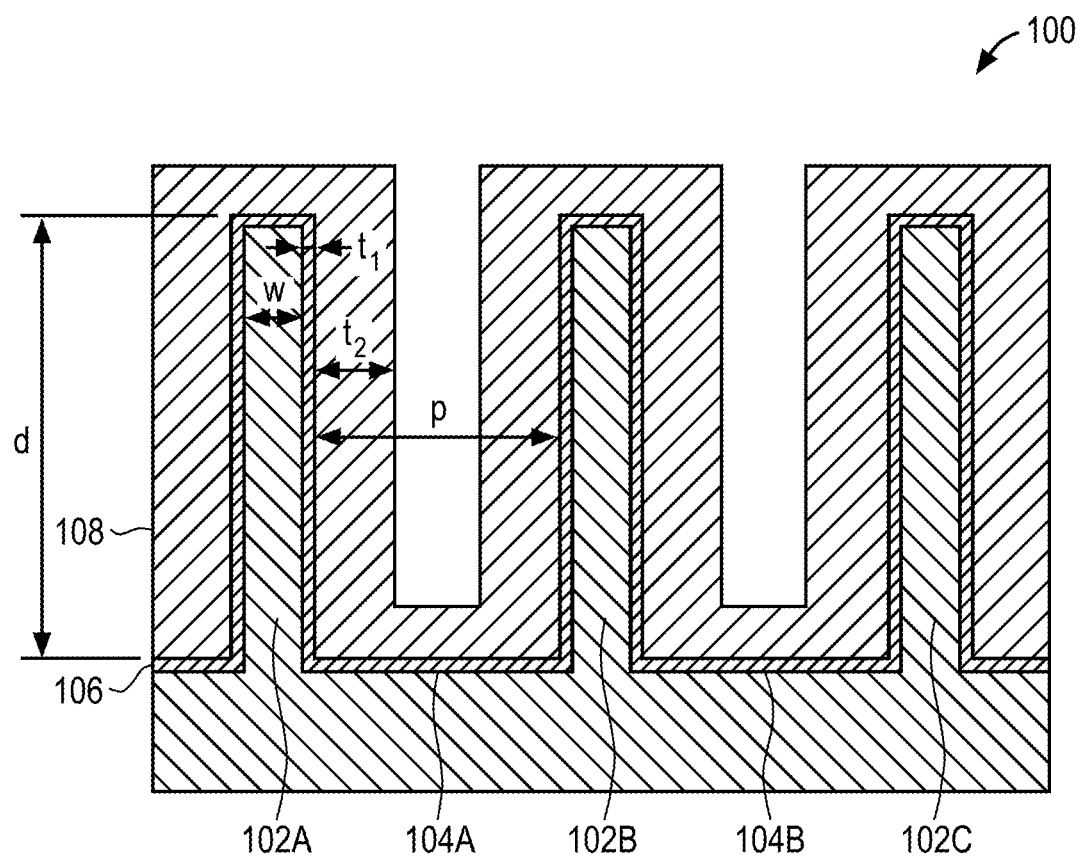
FIG. 1 shows a cross-sectional side view of one embodiment of a grating.

FIG. 1 shows a cross-sectional side view of one embodiment of an electroplated grating. Grating 100 may be formed by a collection of regularly spaced, parallel, elongated elements 102A, 102B, 102C (e.g. gratings), which are separated by trenches 104A, 104B. In one embodiment, grating 100 may be a nonmetallic grating formed from a nonmetallic substrate. Representatively, grating 100 may be a silicon grating formed by a deep reactive-ion etching (DRIE) process such that grating 100 is a high aspect-ratio grating. In other words, the depth (d) of elongated elements 102A-102C is much greater than their width (w). Representatively, in one embodiment, grating 100 may have an aspect-ratio of at least 20:1, at least 26:1, at least 50:1 or from about 20:1 to about 60:1, or from 26:1 to 50:1. Representatively, the depth (d) of each of elongated elements 102A-102C may be from about 20 microns to about 60 microns, for example, from about 26 microns to about 50 microns. The width (w) of each of elongated elements 102A-102C may be from about 0.5 microns to about 1.5 microns, for example, 1 micron. In addition, a pitch (p), or spacing between each of elongated elements 102A-102C may be from about 1 micron to about 5 microns, for example, from about 2 microns to about 4 microns, or 3 microns.

As previously discussed, in order for grating 100 to be suitable for use in optics applications, such as x-ray imaging, grating 100 must include a metallic x-ray absorbing material, for example, gold. Thus, in embodiments where grating 100 is a DRIE silicon grating, it must be coated with the x-ray absorbing material. Grating 100, however, is first coated with a seed layer 106 followed by a metallic layer 108. The seed layer 106 facilitates coating of grating 100 with the metallic layer 108, as will be discussed in more detail below.

In one embodiment, seed layer 106 may be made of a metallic material capable of uniformly and conformally coating grating 100. In other words, a thickness (t1) of seed layer 106 is the same along the entire surface of grating 100 and the profile of grating 100 remains substantially the same after application of seed layer 106. In one embodiment, seed layer 106 may be a platinum layer or any conducting material (e.g. a metal such as palladium) applied to grating 100 using an atomic layer deposition (ALD) process. Although other processes can be used to apply a platinum layer to a structure, such processes are unable to uniformly and conformally coat high-aspect ratio structures such as grating 100. Thus, ALD processing is critical to formation of seed layer 106 on grating 100. In one embodiment, seed layer 106 may have a thickness (t1) of from about 20 nanometers to about 30 nanometers, for example, from about 22 nanometers to about 27 nanometers, for example, 24 or 25 nanometers.

Metallic layer 108 may be applied over seed layer 106. Metallic layer 108 may be made of an x-ray absorbing material, for example, gold (Au). It is further critical that metallic layer 108 uniformly and conformally coat grating 100 so that, for example, accurate x-ray results can be achieved using grating 100. In this aspect, metallic layer 108 may be deposited using an electroplating process as will be described in further detail below. In one embodiment, metallic layer 108 may have a uniform and conformal thickness (t2) of from about 0.1 microns to about 1.5 microns, for example, from about 0.2 microns to about 1.2 microns, for example, from 0.25 microns to 1 micron, or from 0.4 microns to 0.6 microns.

As previously discussed, in the case of a high aspect-ratio silicon grating such as grating 100 discussed herein, it is difficult to uniformly and conformally coat the grating with an x-ray absorbing material such as gold because most processing techniques cause a shadowing effect in which the coating collects at the top of the grating and blocks off deposition at the bottom of the grating resulting in a thinner coating at the bottom than the top. It was, however, surprising and unexpectedly found that a uniform and conformal coating of a metallic material such as gold can be applied to grating 100 by first forming seed layer 106 using ALD followed by formation of the metallic layer 108 using an electroplating process. The critical ALD and electroplating processing steps for coating grating 100 will now be described in reference to FIG. 2-FIG. 6.

Figure 2:
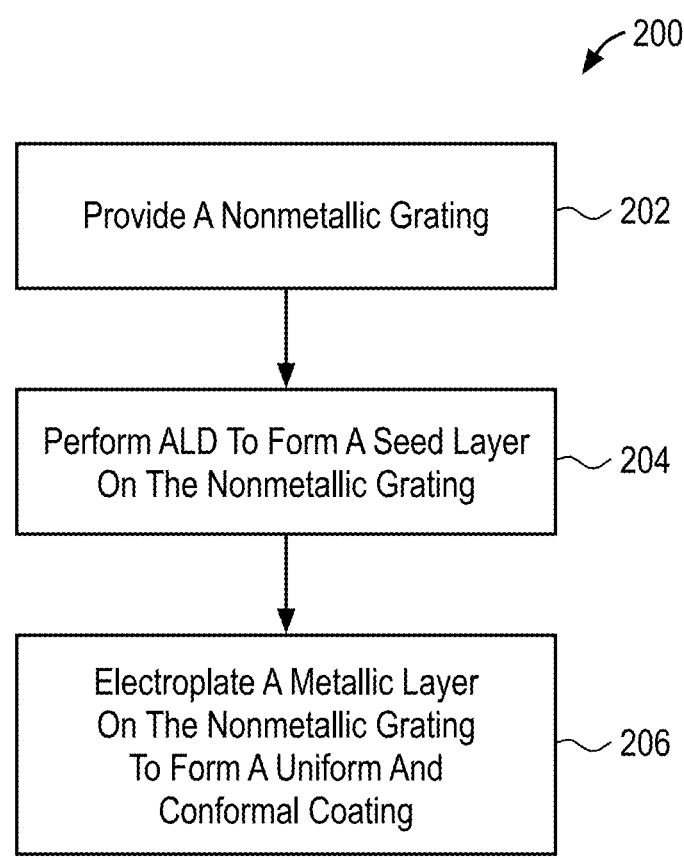
FIG. 2 shows an illustrative process for manufacturing an electroplated grating according to one embodiment.

FIG. 2 shows an illustrative process for manufacturing an electroplated grating according to one embodiment. Process 200 involves first providing a grating (block 202). The grating may be a grating such as grating 100, for example, a DRIE silicon grating have a high aspect-ratio of 50:1. A conducting seed layer is then applied to the grating using ALD (block 204). The seed layer may be a seed layer such as that previously discussed, for example, a platinum seed layer that uniformly and conformally coats the grating. Next, a metallic layer is electroplated onto the seed layer (block 206). The metallic layer may be a metallic layer such as the previously discussed metallic layer, for example, a gold layer that uniformly and conformally coats the grating.

The critical parameters for forming the seed layer using ALD will now be discussed in more detail. Representatively, once the nonmetallic grating is cleaned (e.g. using standard UV/ozone cleaning process for 10 minutes), it is placed inside an ALD reaction chamber. The grating is oriented to allow the flow of the reactor to be parallel to the trench features on the grating. In some embodiments, the ALD chamber is a warm wall reactor heated with heating tape. Inside the chamber is a hot stage that is heated to about 300° C. for the deposition process. A critical feature of the ALD chamber is that it is equipped with a back-purge mechanism that promotes the delivery of the platinum ALD precursor (as well as other solid ALD precursors) into the ALD reaction flow tube. This back-purge flow is incorporated into the major carrier flow when no platinum ALD precursor is being delivered. When a platinum ALD precursor pulse is being performed, the back-purge is directed to the back end of the platinum precursor chamber and helps facilitate the transport of the platinum ALD precursor vapor (as well as other low vapor pressure ALD precursor solids) into the reaction flow tube and across the surface of the grating. The specific back-purge features of the ALD reactor will be described in more detail in reference to FIG. 3 and FIG. 4.

In one embodiment, the ALD chamber uses nitrogen as the carrier gas. The major nitrogen gas flow rate may be, for example, about 100 standard cubic cm per second (sccms) and the minor gas flow rate may be about 20 sccms. The pressure in the ALD chamber during the platinum ALD process may be about 1.5 Torr. Alternating pulses of platinum precursor, (methylcyclopentadienyl)trimethyl platinum, and oxygen may be used to grow the platinum ALD seed layer (block 204). In one embodiment, the pulse and purge cycles of the platinum precursor and oxygen may be 1 second pulse, 20 second purge for the platinum precursor and 2 second pulse and 15 second purge for the oxygen. This sequence produces pressure pulses of 30 mTorr of the platinum ALD precursor and 75 mTorr of oxygen. The nominal ALD growth per cycle for the platinum ALD using the above-described configuration is about 0.07 nm per ALD cycle. In another embodiment, an adhesion layer such as aluminum oxide can be applied using ALD prior to the platinum layer.

In one embodiment, to apply a platinum seed layer having the desired thickness, 300 to 375 cycles of ALD are performed. This results in a thickness of 22 nm to 27 nm.

Once the seed layer is applied, for example, as described above, the metallic layer is formed over the seed layer. The critical parameters for forming the metallic layer using electroplating will now be discussed in more detail. Representatively, the grating having the seed layer applied thereon is placed within an electroplating chamber. As will be described in more detail in reference to FIG. 5, the electroplating chamber includes an electroplating bath having a laminar flow profile, as opposed to a typical agitated flow, which was unexpectedly and surprisingly found to facilitate formation of a more uniform and conformal metallic layer coating on a high aspect-ratio grating such as that disclosed herein. In addition, it was further found that by increasing the amount of rest time between forward pulses, a more uniform and conformal metallic layer coating can be achieved. Representatively, the pulse parameters may include an on time of about 357 microseconds and an off time of about 96428 microseconds (96.428%). The pulse frequency may be less than 700 Hz. For example, from about 50 Hz to about 700 Hz, or from 70 Hz to about 250 Hz, or from about 75 Hz to about 150 Hz, or about 100 Hz. It is noted that this frequency is much lower than the typically used electroplating pulse frequency. It was surprisingly found, however, that using such a low frequency was able to accommodate the increased diffusion challenges of the high aspect-ratio gratings. In particular, the modified pulse is capable of accounting for kinetic and diffusion limitations in a way that allows for uniform plating simultaneously in three directions. In addition, the pulsed current needed for uniformly and conformally coating a high aspect-ratio grating as described herein may be approximately 2 mA/cm². It is noted that the pulsed current readout is usually an average and therefore much lower than the pulsed current amplitude, which must be accounted for.

In addition, it was surprisingly and unexpectedly found that modifying a concentration of certain components within the electroplating chamber bath can facilitate uniform and conformal coating of the high aspect-ratio gratings disclosed herein. Representatively, typically the bath solution includes gold ions and thallium, which is a grain size reducer. Thallium is typically found within commercially available bath solutions in an amount of about 80 ppm. It was surprisingly and unexpectedly found that when the thallium concentration was reduced, a more uniform and conformal coating could be achieved. Representatively, in one embodiment, the concentration of thallium used in the bath is less than 80 ppm, for example, less than 60 ppm, or from about 60 ppm to about 30 ppm, for example, from about 40 ppm to about 50 ppm. Increasing the gold ion concentration also showed improvements in the deposition morphology. The adjustments to the deposition chemistry as well as the AC pulse that was applied work synergistically to produce uniform and conformal high aspect ratio coatings.

Figure 3:
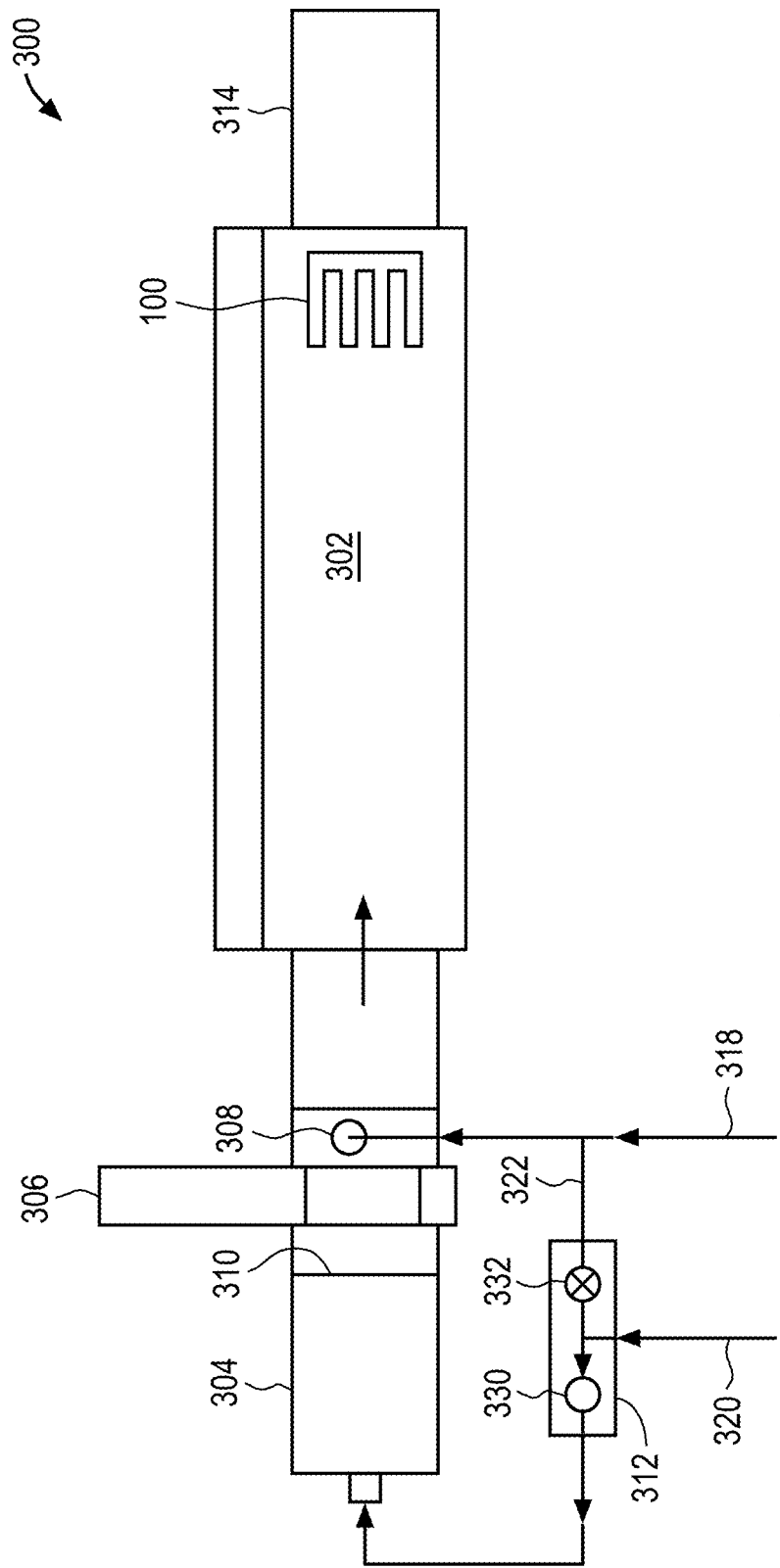
FIG. 3 shows a schematic cross-sectional view of one embodiment of an atomic layer deposition reactor with a back purge feature enabled.

FIG. 3 shows a schematic cross-sectional view of one embodiment of an atomic layer deposition reactor with a back-purge feature enabled From FIG. 3, it can be seen that ALD reactor 300 includes an ALD chamber 302, which in some embodiments may be a heated chamber. ALD chamber 302 is dimensioned to hold, for example, a grating 100 as previously discussed. A solid precursor chamber 304, which may also be heated, is connected to the ALD chamber 302. A solid form of the desired ALD precursor (e.g. platinum) for plating of the grating within the ALD chamber 302 is placed within the precursor chamber 304. An isolation valve 306, which isolates and helps control a flow of the precursor from precursor chamber 304 to ALD chamber 302, is positioned between the ALD chamber 302 and the precursor chamber 304. In addition, an input port 308 for introducing a carrier gas (e.g. nitrogen) into the reactor to help carry the precursor vapors (e.g. oxygen and platinum) to ALD chamber 302 is formed between the isolation valve 306 and ALD chamber 302. A heated screen 310 to help vaporize the solid precursor may further be provided between the delivery chamber 304 and isolation valve 306. Reactor 300 further includes an exhaust output channel 314 at an end of ALD chamber 302.

A primary carrier gas (e.g. nitrogen) may be input to carrier gas input port 308, and in turn ALD chamber 302, through primary carrier gas input tube 318. In addition, input tube 318 may be connected to the back end of delivery chamber 304 via back-purge tube 322. A back-purge gas valve manifold 312 and secondary carrier gas input tube 320 are fluidly connected to a portion of back-purge tube 322 which is between input tube 318 and delivery chamber 304. The secondary carrier gas input tube 320 may be used to introduce an additional carrier gas into the reactor 300. Valve manifold 312 may include a first valve member 330 between secondary carrier gas input tube 320 and delivery chamber 304 and a second valve member 332 between secondary gas input tube 320 and primary carrier gas input tube 318. In this aspect, valve manifold 312 can be used to control a direction of the additional carrier gas that is input to the reactor through secondary carrier gas input tube 320. Representatively, when first valve member 330 is open and second valve member 332 is closed, the carrier gas input through secondary carrier gas input tube 320 flows toward delivery chamber 304 (as illustrated by the arrows). Alternatively, when first valve member 330 is closed and second valve member 332 is open, the carrier gas input through secondary carrier gas input tube 320 flows toward the primary carrier gas input tube 318 and into ALD chamber 302.

During operation, when the back-purge feature is enabled, the first valve member 330 is opened allowing a small amount of the additional carrier gas (previously referred to as the minor gas flow) introduced through secondary carrier gas input tube 320 to travel into the back end of delivery chamber 304 in the direction of the arrows. This in turn pushes the solid precursor within delivery chamber 304 through screen 310 (where it becomes a solid precursor vapor) and past the open isolation valve 306. The pushing of the solid precursor by this back-purge feature, in combination with the carrier gas (previously referred to as the major carrier gas flow) introduced through input tube 318, causes the precursor vapor to travel into ALD chamber 302. It is noted that due to the diversion of the additional carrier gas into delivery chamber 304, as opposed to ALD chamber 302, there is a slight pressure drop in ALD chamber 302. This pressure drop creates a pulling effect, which effectively pulls the precursor vapor into ALD chamber 302, and thereby further facilitates transfer of the precursor to ALD chamber 302. It is further noted that since only a small amount of the carrier gas input into the reactor is diverted through the back-purge feature, there is no substantial change in the normal carrier gas flow.

Figure 4:
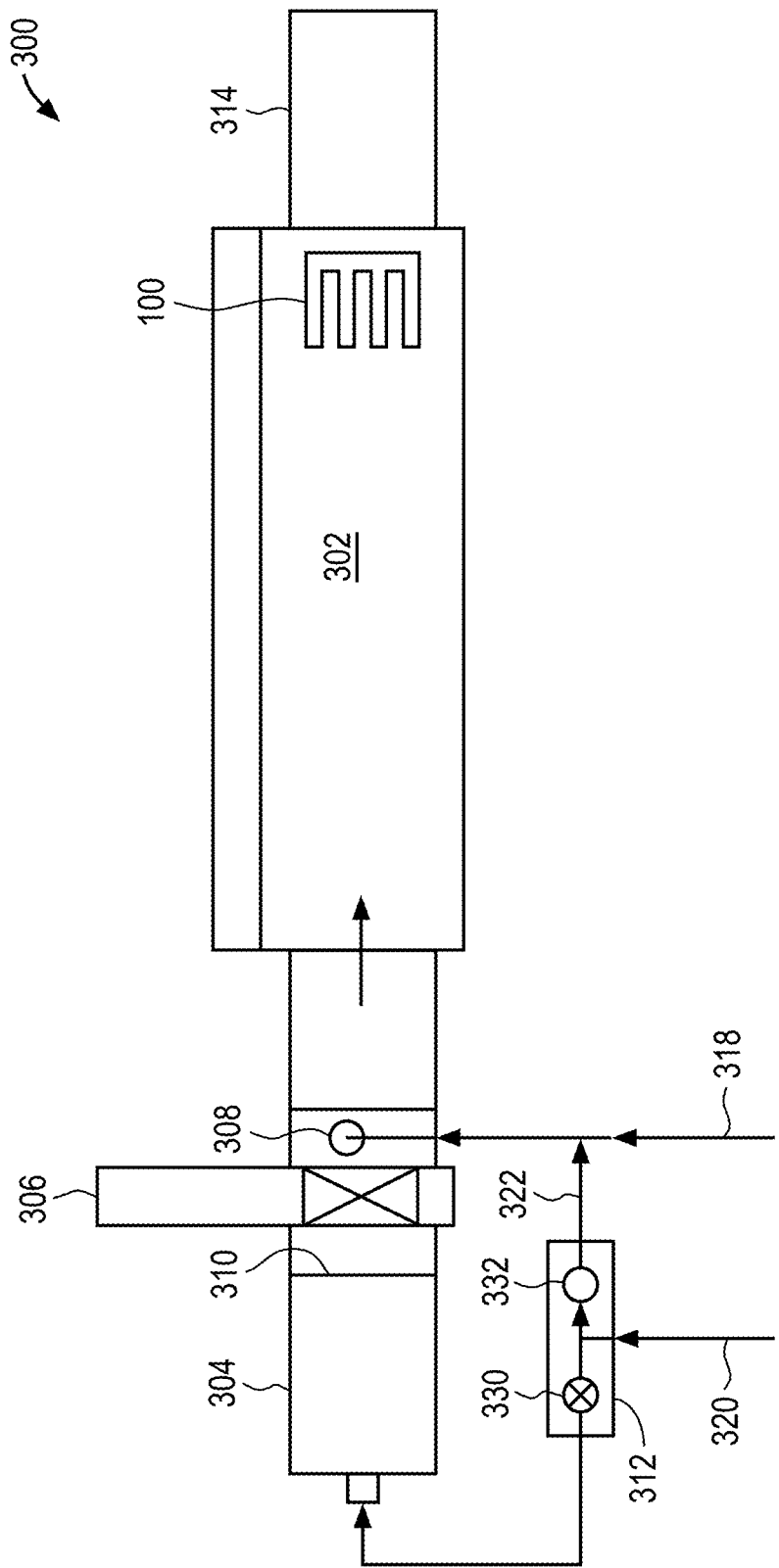
FIG. 4 shows a schematic cross-sectional view of the atomic layer deposition reactor of FIG. 3 with the back purge feature disabled.

FIG. 4 shows a schematic cross-sectional view of the atomic layer deposition reactor of FIG. 3 with the back-purge feature disabled. As can be seen from FIG. 4, when the back-purge feature is disabled, the first valve member 330 of the back-purge carrier gas valve manifold 312 and the isolation valve 306 are closed to prevent the carrier gas from traveling into delivery chamber 304. The second valve member 332, however, is open. In this aspect, the additional carrier gas introduced into secondary carrier gas input tube 320 travels through tube 322 toward input tube 318, where it combines with the carrier gas introduced through input tube 318. The combined carrier gases then travel directly to ALD chamber 302.

Figure 5:
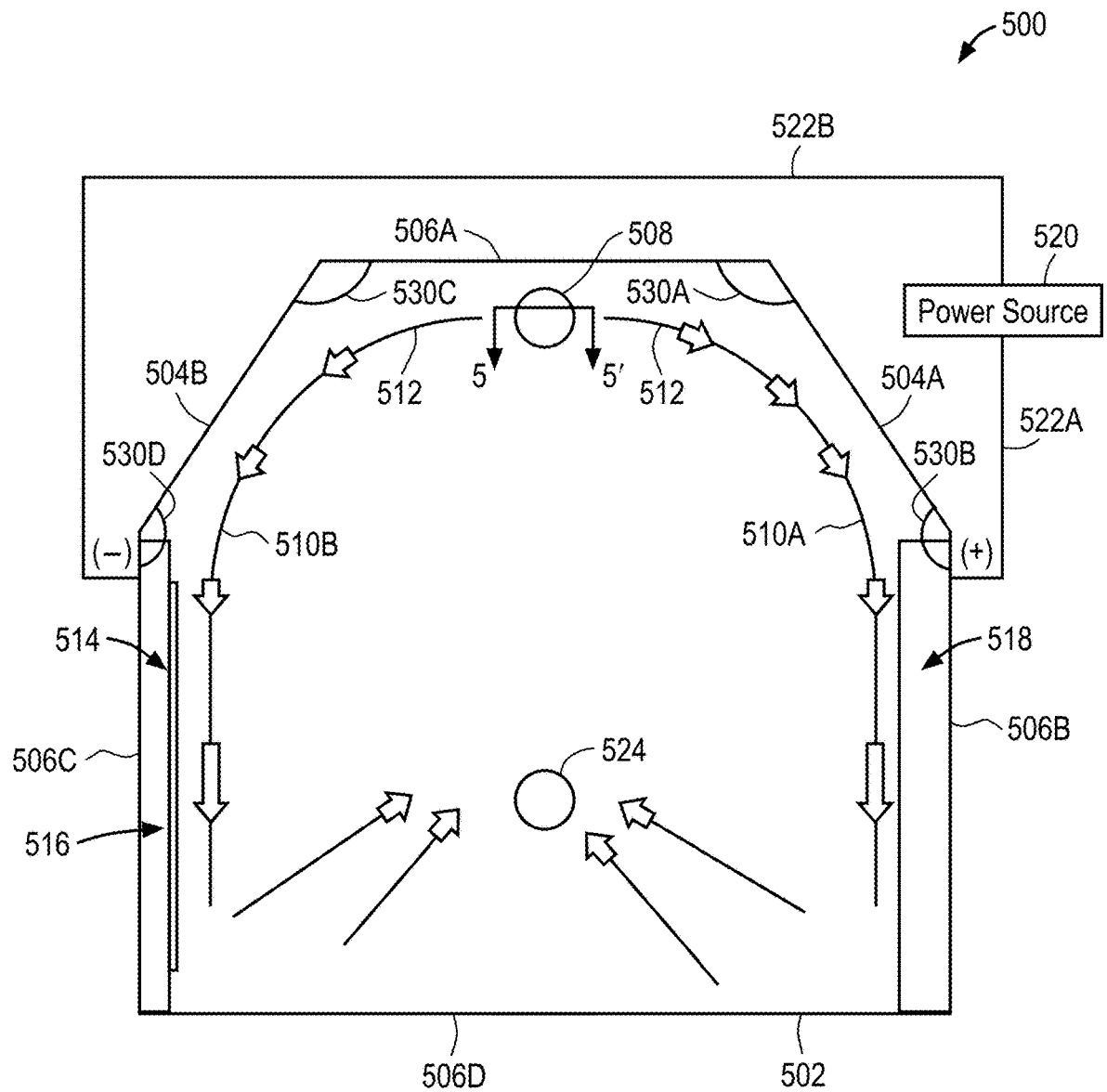
FIG. 5 shows a schematic top view of one embodiment of an electroplating chamber used to manufacture an electroplated grating.
Figure 6:
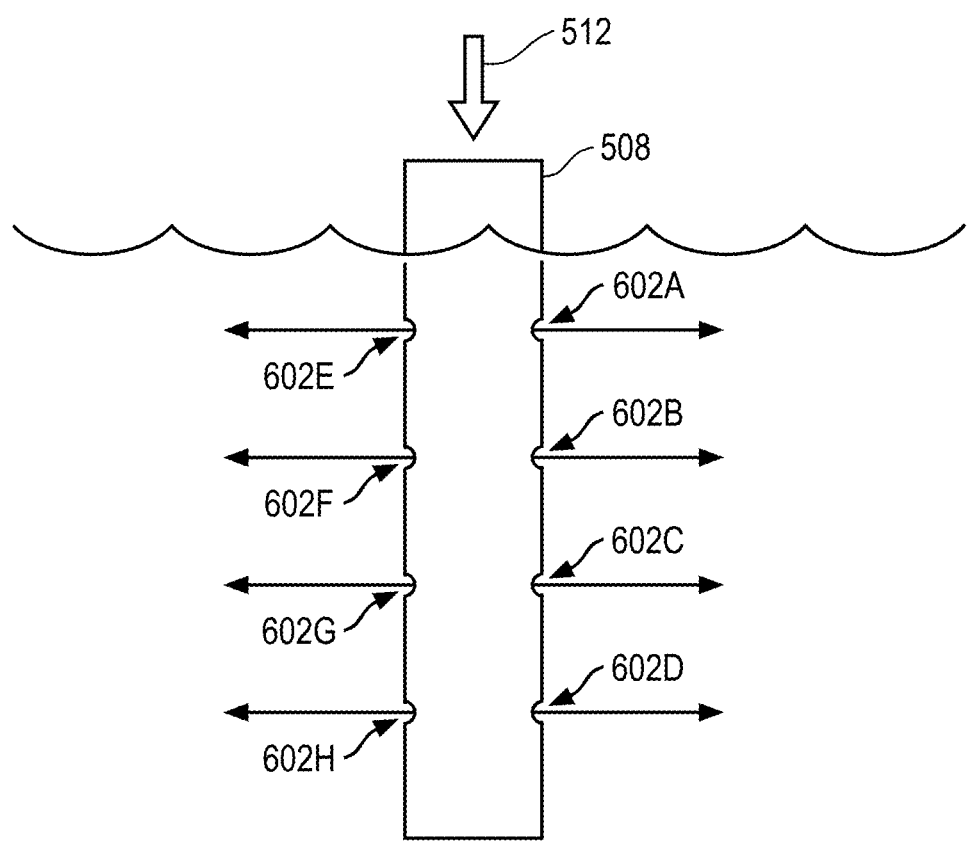
FIG. 6 shows a schematic of a portion of the solution inlet of the electroplating chamber of FIG. 5 along line 5-5'.

FIG. 5 shows a schematic top view of one embodiment of an electroplating chamber used to manufacture an electroplated grating. From this view, it can be seen that electroplating chamber 500 includes a tank 502 having angled walls 504A and 504B connecting sidewall 506A with sidewalls 506B and 506C, respectively. A bath solution inlet tube 508 is positioned near sidewall 506A, between angled walls 504A and 504B. Bath solution inlet tube 508 may include a plurality of bath solution outlet ports 602A, 602B, 602C, 602D, 602E, 602F, 602G, 602H, as illustrated in FIG. 6, which is a cross-sectional view of tube 508 of FIG. 5 along line 5-5'. Although 8 outlet ports 602A-602G are illustrated, it is contemplated that any number of ports sufficient to direct a bath solution toward angled walls 504A and 504B may be provided. Outlet ports 602A-602G may direct the bath solution 512 out the sides of the bath solution inlet tube 508 toward angled walls 504A and 504B. When bath solution 512 is directed toward angled walls 504A and 504B, angled walls 504A and 504B redirect bath solution 512 over the grating/cathode 514 mounted to substrate 516 along sidewall 506C and the anode 518 mounted along sidewall 506B with a laminar flow profile 510A and 510B. It was surprisingly and unexpectedly found that when bath solution 512 is directed along the grating/cathode 514 in the laminar flow profile 510A and 510B, a more conformal and uniform metallic coating is formed on a high aspect-ratio grating such as that disclosed herein. Tank 502 may further include sidewall 506D connecting sidewalls 506B and 506C and a bath solution outlet tube 524 near sidewall 506D. Bath solution outlet tube 524 may be configured to draw bath solution 512 from tank 502 and through an associated filter (not shown). It is further to be understood that, although not illustrated, tank 502 includes a top wall and a bottom wall such that bath solution 512 can be held therein.

In some embodiments, angled walls 504A and 504B form a substantially chamfered edge connecting sidewall 506A with sidewalls 506B and 506C, respectively. In other words, angled walls 504A and 504B form a substantially 45 degree angle with respect to what would otherwise be a 90 degree angle between sidewall 506A and sidewalls 506B and 506C. Said another way, angled wall 504A forms angles 530A and 530B with respect to walls 506A and 506B, respectively, and angled wall 504B forms angles 530C and 530D with respect to walls 506A and 506C, respectively. Angles 530A-530D may be greater than 90 degrees, for example, at least 100 degrees, or at least 120 degrees, for example, from about 100 degrees to about 150 degrees, or from about 110 degrees to 145 degrees, or from 125 degrees to 135 degrees.

Electroplating chamber 500 may further include a power source 520 (e.g., an AC power source) configured to provide power via electrical connections 522A and 522B to anode 518 and grating/cathode 514, respectively.

The following example illustrates the criticality of the electroplating parameters discussed herein in forming a uniform and conformal coating of a metallic layer (e.g. gold layer) on a high aspect-ratio silicon grating having a platinum seed layer as previously discussed.

Example I

Conformal gold electroplated coatings are most commonly produced by applying direct current (DC) to aqueous gold plating chemistries. Initial attempts that used DC deposition to coat a high aspect ratio silicon (Si) substrate with DRIE gratings resulted in heavy localized plating on the tops of gratings with minimal plating deep in the trenches. The high potential required to drive this current in a diffusion limited regime resulted in a high stress deposit and the atomic layer deposition (ALD) platinum (Pt) delaminated from the Si. The high aspect-ratio of the Si gratings restricted the plating in the trenches and resulted in extremely localized and high current density at the top of the gratings. This caused dendritic and dull deposit appearance.

Based on these results, an alternating current (AC) plating with the pulse that has been used in electrofilling high aspect ratio features was tried. In particular, an AC pulse profile of ¼ duty and 700 Hz was used. The pulse was selected for bottom up filling and showed improvement over DC; but gold (Au) ion depletion, due to the plating on top and sides of the gratings, still lead to underplating deeper in the trenches.

The amount of rest time between forward pulses was therefore increased to 300 Hz to allow the gold chemistry to reach a concentration equilibration between deposition times. The length of the pulse was not changed because prior results showed smooth and uniform grain deposits at this duration. It was found that the increase in rest time improved the uniformity of the deposit across the topography. However, there was still a thickness gradient in the Au electroplated coating with a thicker coating at the top of the grating and a thinner coating towards the base of the channel.

Based on this information the rest period was further lengthened by reducing the frequency to 100 Hz. This surprisingly and unexpectedly resulted in a uniform and highly conformal gold coating with no signs of diffusion limitations into the deep Si gratings. It is believed that the modified pulse is capable of accounting for kinetic and diffusion limitations in a way that allows for uniform plating simultaneously in three directions. This resulted in a silicon DRIE grating with approximately 1 micron thick gratings and 4 microns center to center spacing, being uniformly coated in approximately 1 micron of gold in a periodic repeat of 1 micron gold, 1 micron silicon, 1 micron gold and 1 micron of void space. Because silicon and the void space are transparent to x-rays, the device simulates simply a 1 micron gold grating on a 2 micron pitch. The tops and bottoms of the gratings also had a 1 micron coating of gold, but this thin layer was negligible when penetration was perpendicular.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An x-ray detector, comprising:
    a silicon substrate having gratings with an aspect-ratio of at least 20:1;
    an atomic layer deposition (ALD) seed layer formed on the gratings and uniformly and conformally coating the gratings; and
    an electroplated metallic layer formed on the seed layer, wherein the electroplated metallic layer is formed of an x-ray absorbing material, and further wherein the electroplated metallic layer uniformly and conformally coats the gratings.

2. The x-ray detector of claim 1, wherein the gratings have an aspect ratio of at least 50:1.

3. The x-ray detector of claim 1, wherein the gratings have an aspect ratio of at least 60:1.

4. The x-ray detector of claim 1, wherein a spacing between the gratings is 5 microns or less.

5. The x-ray detector of claim 1, wherein the seed layer comprises platinum.

6. The x-ray detector of claim 1, wherein the x-ray absorbing material comprises gold.

7. The x-ray detector of claim 1, wherein a thickness of the metallic layer is from 0.25 microns to 1.2 microns.

8. The x-ray detector of claim 1, wherein a thickness of the metallic layer is substantially the same along the entire surface of each of the gratings.

9. The x-ray detector of claim 1, wherein the gratings comprise elongated elements having a depth of at least 26 microns and a pitch between each of the adjacent elongated elements is 2 microns or less.

10. The x-ray detector of claim 1, wherein the seed layer comprises palladium.

11. The x-ray detector of claim 1, wherein the electroplated metallic layer is formed on the seed layer by pulsing an electroplating bath solution comprising thallium across the gratings at a pulse frequency of from 50 Hz to 100 Hz, a pulse profile of ¼ duty and a pulse current of 2 mA/cm$^2$, and the metallic layer comprises a thickness of from 0.1 microns to 0.6 microns.

12. The x-ray detector of claim 1, wherein the electroplated metallic layer is formed by submerging the gratings with the seed layer thereon within an electroplating reaction tank, the electroplating reaction tank having outer sidewalls that form chamfered corners, wherein the chamfered corners are dimensioned to generate a laminar flow profile of an electroplating bath solution within the tank, and wherein the electroplating bath solution comprises a thallium concentration of from 40 ppm to 60 ppm.

13. The x-ray detector of claim 1, wherein the electroplated metallic layer formed on the seed layer is formed by exposing the electroplated metallic layer to an alternating current forward pulse from 70 Hz to 700 Hz.

14. The x-ray detector of claim 1, wherein the electroplated metallic layer formed on the seed layer is formed by exposing the electroplated metallic layer to an electrical current forward pulse of from 340 to 365 microseconds.

15. An x-ray detector, comprising:
    a silicon substrate having gratings with an aspect-ratio of at least 20:1;
    an atomic layer deposition (ALD) seed layer formed on the gratings; and
    an electroplated metallic layer formed on the seed layer, wherein:
    the electroplated metallic layer is formed of an x-ray absorbing material;
    the electroplated metallic layer uniformly and conformally coats the gratings; and
    the seed layer is formed via a process comprising:
        (i) placing the gratings in an ALD reactor, the ALD reactor having (a) a back purge mechanism to facilitate delivery of an ALD precursor vapor across the silicon substrate having gratings, and (b) a pressure of about 1.5 Torr; and
        (ii) alternating pulses of an ALD precursor and a precursor vapor to grow the seed layer, wherein the pulses are alternated to produce pressure pulses of 30 mTorr of the ALD precursor and 75 mTorr of the precursor vapor and result in a seed layer having a uniform thickness of from 22 nm to 27 nm.

* * * * *